United States Patent [19]

Ho

[11] Patent Number: 5,889,432
[45] Date of Patent: Mar. 30, 1999

[54] TWO-STAGE DIFFERENTIAL MICROWAVE AMPLIFIER WITH BIAS CURRENT SHARING AND AUTOMATIC GAIN CONTROL

[75] Inventor: Ian E. Ho, Alamo, Calif.

[73] Assignee: Samsung Electronics Co., Ltd., Seoul, Rep. of Korea

[21] Appl. No.: 941,125

[22] Filed: Sep. 30, 1997

[51] Int. Cl.[6] .............................. H03F 3/45; H03H 3/30
[52] U.S. Cl. ..................... 330/255; 330/254; 330/260; 330/311
[58] Field of Search ................................. 330/252, 253, 330/254, 260, 311

[56] References Cited

U.S. PATENT DOCUMENTS 3,838,210  9/1974  Peil ...................................... 330/254 X
3,988,598 10/1976  Ishigaki et al. ..................... 330/254 X Primary Examiner—James B. Mullins
Attorney, Agent, or Firm—Townsend and Townsend and Crew LLP

[57] ABSTRACT

A multi-stage differential amplifier includes first and second DC current paths with first and second stage amplification transistors included in each current path so that both stages share the same DC bias current. In one embodiment, an automatic gain control circuits are included in the second stage to control gain and maintain low noise figure.

4 Claims, 3 Drawing Sheets

TWO-STAGE DIFFERENTIAL MICROWAVE AMPLIFIER WITH BIAS CURRENT SHARING AND AUTOMATIC GAIN CONTROL

BACKGROUND OF THE INVENTION

Multi-stage differential amplifiers usually include separate stages each having a current source and load. Thus, duplicate circuit elements and excessive DC power loss due to current loads characterize these amplifiers.

Additionally, in microwave circuits a balun is required to couple a single-ended signal into balanced mixers or other elements that require a differential signal. However, baluns are difficult and expensive to integrate into Monolithic Microwave Integrated Circuits (MMICs) and baluns introduce loss which also increases the overall noise figure.

SUMMARY OF THE INVENTION

The present invention is a multi-stage differential amplifier where each stage shares the DC bias current.

According to one aspect of the invention, a differential amplifier includes left and right hand side current paths including series-connected first and second amplification transistors and an active load. An input signal is coupled to a control input of the first amplification transistor which causes a first stage voltage output to be generated by the active load. The first stage output voltage is coupled to the input of the second stage amplification transistor which causes a second stage output voltage to be generated at the active load.

According to another aspect of the inventions, a variable conductance is inserted in series with the virtual ground, forming a variable feedback circuit, which controls the gain of the amplifier.

According to another aspect of the invention, additional amplification transistors and active loads are included in each current path to form additional stages of the amplifier.

According to another aspect of the invention, automatic gain control circuits are included in each stage of the amplifier except the first stage.

Other features and advantages of the invention will become apparent in view of the following detailed description and appended drawings.

DESCRIPTION OF THE PREFERRED EMBODIMENT

Figure 1:
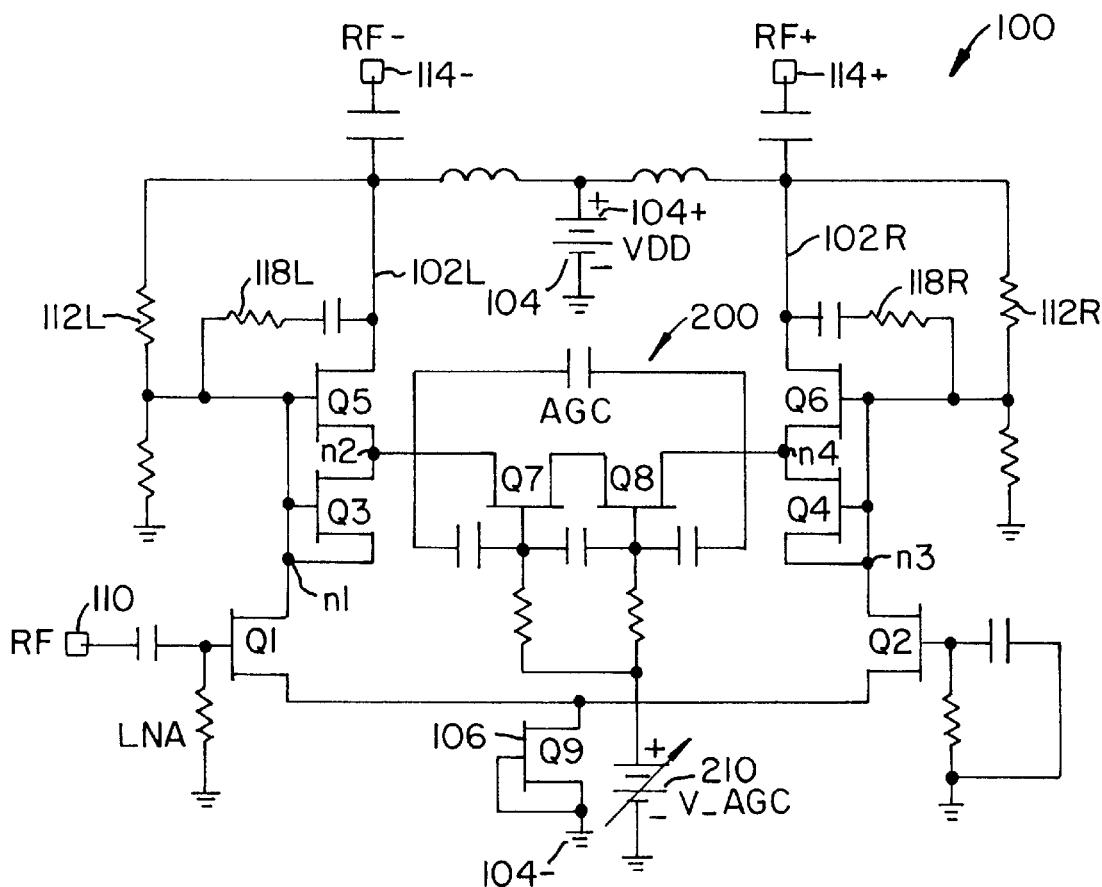
FIG. 1 is a circuit diagram of a preferred embodiment of the invention.

FIG. 1 is a detailed schematic diagram of a preferred embodiment of the invention. In FIG. 1, a differential amplifier 100 includes left and right current paths 102L and R for conducting current between the positive terminal 104+ of a first power supply 104 and a current source 106 coupled to the negative terminal 104– of the power supply 104.

The left-hand current path 102L includes a first stage amplification transistor Q1, and active load Q3, and a second stage amplification transistor Q5. Each transistor Q1, Q2, and Q3 has source and drain terminals and a control gate.

The right-hand current path 102R includes a first stage amplification transistor Q2, and active load Q4, and a second stage amplification transistor Q6. Each transistor Q2, Q4, and Q6 has source and drain terminals and control gate.

In the left-hand current path 102L, the drain of Q is connected to the source of Q3 at a first node n1 and the drain of Q3 is connected to the source of Q5 at a second node n2. The gates of Q3 and Q5 are also coupled to the first node n1. The gate of Q1 is AC coupled to an RF signal input 110 and is also resistively coupled to ground. The gates of Q5 and Q3 are biased by a voltage divider 112L and node n1 is coupled to an RF– 114– output by an AC coupling circuit 118L.

In the right hand current path 102R, the drain of Q2 is connected to the source of Q4 at a third node n3 and the drain of Q4 is connected to the source of Q6 at a fourth node n4. The gates of Q4 and Q6 are also coupled to the second node n2. The gate of Q2 is AC coupled to ground and is also resistively coupled to ground. The gates of Q4 and Q6 are biased by a voltage divider 112R and node n3 is coupled to an RF+ 114+ output by an AC coupling circuit 118R.

Node n2 in the left-hand current path 102L and node n4 in the right-hand current path 102R are coupled by an automatic gain control (AGC) circuit 200 formed by series coupled gain transistors Q7 and Q8. The gates of Q7 and Q8 are resistively coupled to a variable voltage source 210. Various DC blocking and AC coupling capacitors and AC blocking inductors are included as understood in the art.

The operation of the circuit depicted in FIG. 1 will now be described. The amplifier is in the quiescent state when no signal is present on the RF input port 110. The same amount of direct current flows through the left and right hand current paths 102 L and R where the magnitude of the current determined by current source which sinks a constant amount of current.

The active load transistors Q3 and QS are connected as current sources and thus have very high impedance. If the circuit elements in the left and right hand current paths 104L and R are well matched the voltage drops across the components will be the same and the voltages at RF– and RF+ 114+ and 114– will be equal, i.e., no differential output signal.

If the input signal amplitude increases to DVin volts at time T0, then the current conducted through Q1 will increase causing more current to flow through the left-hand current path 104L which causes a like decrease in the current flowing through the right hand current path 104R. The increase must be equal to the decrease because the current source causes the sums of both currents to be constant.

Accordingly, the increase in current causes the voltage drop across Q3 (the active load) to increase causing the voltage at node n1 to decrease relative to the quiescent value. Similarly, the voltage at node n3 in the right hand current path 102R increases by the same amount. The voltage change at node n2 is the output, DVout1, of the first stage and is equal to –G1 multiplied by the input voltage, DVin, where –G1 is the gain of the first stage.

As described above, node n1 is coupled to the gate of the second stage amplification transistor Q5. The input voltage to Q5 is the output voltage of the first stage, –G1 multiplied by DVin. Thus, assuming the magnitude of G1 is greater than 1, the amplitude of the input signal to the second stage (G1*DVin) is greater than the amplitude, DVin, of the input signal. The second stage transistor, Q5, decreases the transient current amplitude in response to the input signal to cause decrease in the current flow through the active load, Q3. This decrease causes the voltage level at node ni to increase by a factor equal to the second stage gain (G2) multiplied by the magnitude of the second stage input signal (G1*DVin). Thus the voltage change at ni in response to DVin is the sum of the voltage change caused by the first stage (−G1*DVin) and the voltage change caused by the second stage (G2*G1*DVin), i.e., (G1*G2−G1)*DVin. If G1 and G2 are almost equal then the gain of the amplifier is about G1*(G1−1).

The output voltage generated at n1 is coupled to the RF− port 114− by the AC coupling circuit 118L. Due to the symmetry of the circuit, the voltage at the RF+ port 114+ varies inversely to the voltage at the RF− port 114−.

Thus, a single-ended RF signal input at the RF input port 110 is amplified and output as a differential RF output signal at the RF output ports 114.

The AGC circuit 200 couples the nodes n2 and n4. The conductance of Q7 and Q8 is controlled the by magnitude of the control voltage supplied by the variable voltage source 210. As described above, the magnitude of the differential output RF signal is dependent in the change of magnitudes of currents flowing through the left and right hand current paths 104L and R. Accordingly, if the conductance of Q7 and Q8 is high current will flow between nodes n2 and n4 to decrease the current differences and reduce the gain of the amplifier.

Additionally, two stages of amplification are provided where the stages share the same DC bias current thus simplifying the amplifier. The gain control is embedded in a second stage to provide wide gain control range for specified amplifier noise figure and matching.

Figure 2:
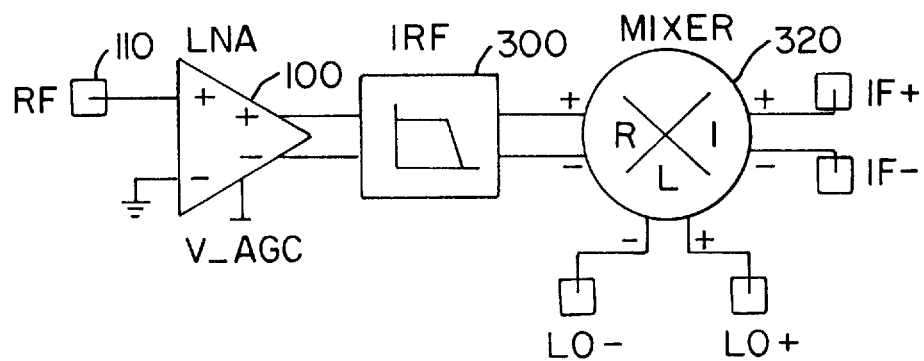
FIG. 2 is a diagram of complete circuit including the amplifier of the present invention.

FIG. 2 depicts the amplifier 100 of the present invention included in a complete circuit configured as a microwave amplifier. The complete circuit further includes an Image Reject Filter 300, and a Double Balanced Mixer 320.

The amplifier depicted in FIG. 1 can be used to provide a differential output into a double balanced mixer 320 so that a balun at the RF input of the mixer is no longer necessary. Alternatively, a differential RF input signal can be applied to the gates of the first stage amplification transistors Q1 and Q2.

Figure 3:
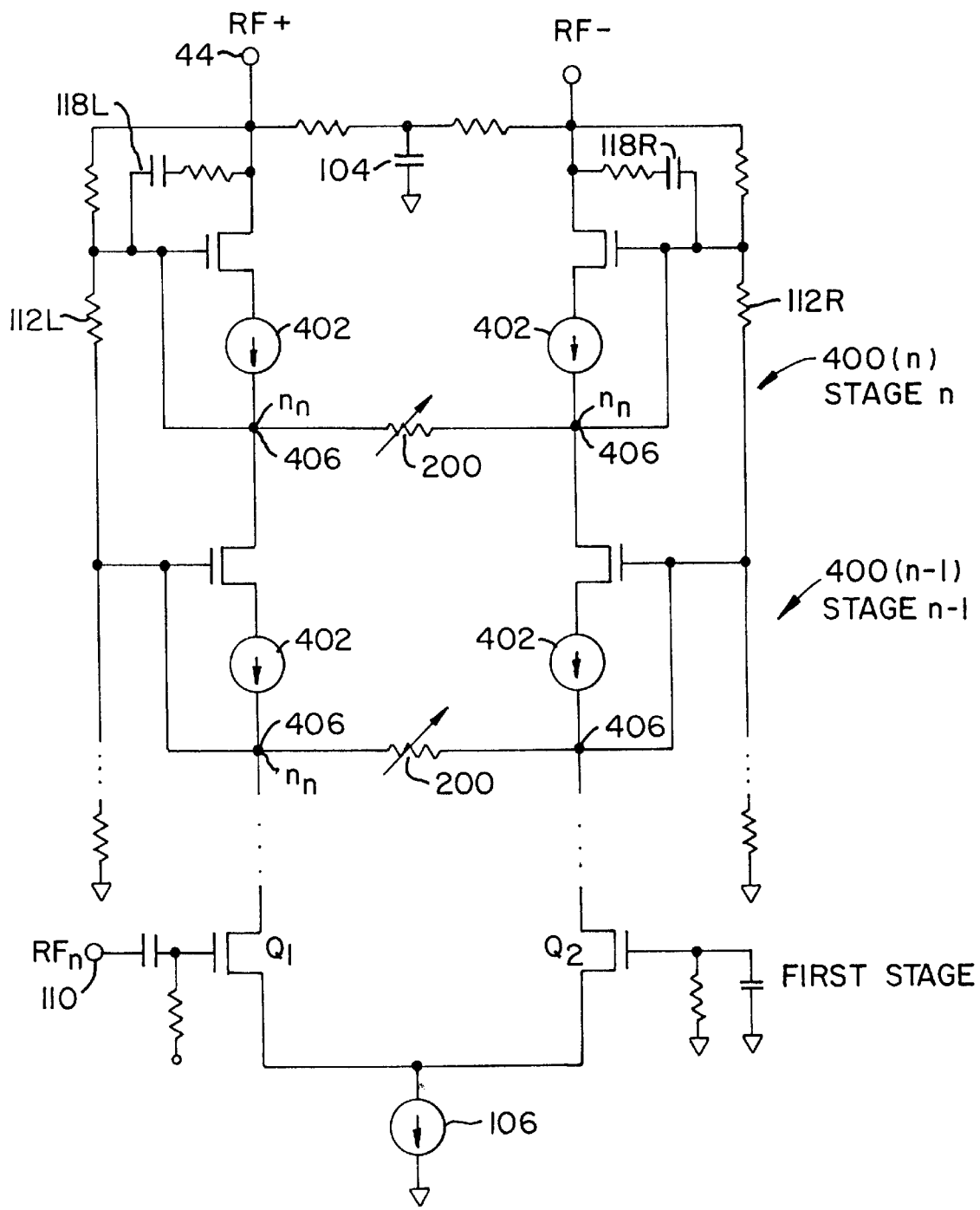
FIG. 3 is a circuit diagram of an alternative embodiment of the invention.

The concept of the invention can also be extended to three or more stages 400 as depicted in FIG. 3. Additional loads 402 and amplification transistor 404 are provided in each current path 102L and R. AGC circuits 200 couple corresponding gain control nodes 406, coupled to the drain of each active load 402, in the left and right hand current paths 104L and R.

The invention has now been described with reference to the preferred embodiments. Alternatives and substitutions will now be apparent to persons of skill in the art. In particular, although the embodiment described utilizes FET transistors bipolar transistors could also be employed. Further, the circuit element utilized as the load could be varied as required. Accordingly, it is not intended to limit the invention except as provided by the appended claims.

What is claimed is:

1. An improved multi-stage amplifier, having a first RF input port, RF− and RF+ output ports, and first and second voltage supply terminals, the amplifier comprising:

a current source coupled to the second voltage supply terminal;

first and second current paths, coupling said current source to said first voltage supply terminal;

with said first current path (FCP) comprising:

an FCP first stage amplification transistor, having first and second terminals and a control terminal, with the first terminal coupled to said current source, and the control terminal coupled to the first RF input port;

an FCP load device, having first and second terminals, with the first terminal of the FCP load device coupled to the second terminal of the FCP first stage amplification transistor;

an FCP second stage amplification transistor, having first and second terminals and a control terminal, with the first terminal of the FCP second stage amplification transistor coupled to the second terminal of the FCP load device at a first FCP node, with the control terminal of the FCP second stage amplification transistor coupled to the second terminal of the FCP first stage amplification transistor, and with the second terminal of the FCP second stage amplification transistor coupled to the first voltage supply terminal;

an FCP AC coupling circuit coupling the first terminal of the load device to the RF− terminal;

with said second current path (SCP) comprising:

an SCP first stage amplification transistor, having first and second terminals and a control terminal, with the first terminal coupled to said current source, and the control terminal coupled to ground;

an SCP load device, having first and second terminals, with the first terminal of the SCP load device coupled to the second terminal of the SCP first stage amplification transistor at a second SCP node;

an SCP second stage amplification transistor, having first and second terminals and a control terminal, with the first terminal of the SCP second stage amplification transistor coupled to the second terminal of the SCP load device at a first SCP node, with the control terminal of the SCP second stage amplification transistor coupled to the second terminal of the SCP first stage amplification transistor, and with the second terminal of the SCP second stage amplification transistor coupled to the first voltage supply terminal; and an SCP AC coupling circuit coupling the first terminal of the load device to the RF+ terminal.

2. The amplifier of claim 1 wherein said FCP load device is an active load comprising:

an FCP active load transistor, having a control terminal coupled to the second terminal of the FCP first stage amplification transistor.

3. The amplifier of claim 1 further comprising:

an automatic gain control circuit forming a path of variable conductance coupling the first FCP node to the first SCP node.

4. The amplifier of claim 1 wherein the amplifier incudes a second RF input port, wherein the control terminal of said SCP first stage amplification transistor is coupled to the second RF input port so that amplifier input signal is a differential signal.

* * * * *